(12) United States Patent
Ossieur et al.

(10) Patent No.: US 9,059,807 B2
(45) Date of Patent: Jun. 16, 2015

(54) LINEAR BURST MODE RECEIVER

(75) Inventors: Peter Ossieur, Bruges (BE); Paul Townsend, Ovens (IE)

(73) Assignee: UNIVERSITY COLLEGE CORK—NATIONAL UNIVERSITY OF IRELAND (IE)

( * ) Notice: Subject to any disclaimer, the term of this patent is extended or adjusted under 35 U.S.C. 154(b) by 119 days.

(21) Appl. No.: 13/699,855

(22) PCT Filed: May 24, 2011

(86) PCT No.: PCT/EP2011/058423
§ 371 (c)(1),
(2), (4) Date: Feb. 4, 2013

(87) PCT Pub. No.: WO2011/147807
PCT Pub. Date: Dec. 1, 2011

(65) Prior Publication Data
US 2013/0121707 A1 May 16, 2013

(30) Foreign Application Priority Data
May 24, 2010 (EP) .................................. 10163701

(51) Int. Cl.
| H04B 10/06 | (2006.01) |
| H04B 10/69 | (2013.01) |
| H04B 10/67 | (2013.01) |
| H03G 3/30 | (2006.01) |

(52) U.S. Cl.
CPC .......... *H04B 10/6931* (2013.01); *H04B 10/672* (2013.01); *H03G 3/3073* (2013.01); *H03G 3/3084* (2013.01)

(58) Field of Classification Search
CPC ........ H04B 10/60; H04B 10/66; H04B 10/67; H04B 10/671; H04B 10/672; H04B 10/673; H04B 10/69; H04B 10/693; H04B 10/6931
USPC .......................................... 398/202, 208–210
See application file for complete search history.

(56) References Cited

U.S. PATENT DOCUMENTS

| 7,539,424 B2 | 5/2009 | Kang et al. |
| 7,863,939 B2 * | 1/2011 | Yamabana et al. .............. 327/58 |
| 2009/0142074 A1 | 6/2009 | Ide |

FOREIGN PATENT DOCUMENTS

| EP | 1032145 A2 * | 8/2000 |
| EP | 1357665 A2 | 10/2003 |
| WO | 2007042507 A2 | 4/2007 |

OTHER PUBLICATIONS

Tine De Ridder et al., A 2.7V 9.8Gb/s Burst-Mode TIA with Fast Automatic Gain Locking and Coarse Threshold Extraction, 2008 IEEE International Solid-State Circuits Conference, ISSCC 2008/ Session 11/Optical Communication 11.1, Feb. 5, 2008, pp. 220-221.
Susumu Nishihara et al., A Burst-Mode 3R Receiver for 10-Gbit/s PON Systems With High Sensitivity, Wide Dynamic Range, and Fast Response, 2008 IEEE, Journal of Lightwave Technology, vol. 26, No. 1, Jan. 1, 2008, pp. 99-107.

* cited by examiner

*Primary Examiner* — Dalzid Singh
(74) *Attorney, Agent, or Firm* — Volpe and Koenig, P.C.

(57) ABSTRACT

The invention provides a linear burst mode receiver comprising a first amplifier connected to a photodiode adapted to detect an optical input burst signal, a second amplifier connected to said photodiode; and means for deriving the peak input current of the detected burst signal using said second amplifier. The invention further provides means for using the derived peak input current to adjust the gain of the first amplifier during the preamble of each burst, such that the output voltage swing of the first amplifier equals a given reference, independent of the strength of the optical input burst signal. The usage of the fast feed-forward automatic gain control mechanism solves the problems with gain switching and non-linearity prevalent in today's burst-mode receivers.

11 Claims, 4 Drawing Sheets

LINEAR BURST MODE RECEIVER

FIELD OF THE INVENTION

The invention relates to optical communication networks. In particular the invention relates to burst mode optical receivers for recovering optical signals transmitted over an optical access network or optical burst switched networks.

BACKGROUND TO THE INVENTION

Burst Mode optical receivers are typically located in the Optical Line Termination (OLT), or service node, or Local exchange, of an optical access network. Such an optical access network typically consists of a number of Optical Network Units (ONUs) located at a subscriber's premises and connected using a tree-like fibre plant to the OLT. The prior art has implemented burst mode receivers in which amplifiers are used whose output voltage is clamped at a fixed value once the input signal strength (voltage or current) exceeds a given value (so-called limiting amplifiers). This behaviour however is highly non-linear, which prevents the use of electronic equalization techniques to mitigate distortion in the input signal and certain classes of advanced modulation formats, which also require a linear receiver.

As all of the ONUs share the same fibre on the same wavelength, time division multiple access (TDMA) is used to transmit data upstream (from the ONUs towards the OLT). In TDMA, each ONU is assigned specific time slots during which it may send a burst of data upstream. As the bursts from different ONUs have undergone different amounts of attenuation while travelling towards the OLT, the signal at the OLT consists of a rapid sequence of bursts whose amplitude can differ greatly from burst to burst. To recover the transmitted data from this signal, a burst mode receiver is needed which quickly adapts its settings (gain and decision threshold) from one burst to the next. Similarly, in optical burst switched networks bursts may arrive at the receiver that have travelled along different paths, and hence have undergone different amounts of attenuation or amplification.

Today, there is significant Industry interest in increasing the bit rate over optical access networks towards 10 Gb/s and beyond. Burst-mode receivers operating at 10 Gb/s have been demonstrated, but still exhibit several problems:

1) Operation at sufficiently high bitrates implies that the properties of the optical fibre, such as chromatic dispersion, may severely distort the transmitted signal. This distortion can be compensated using techniques such as electronic dispersion compensation, but require that the optical receiver is linear with respect to the detected photocurrent. In today's, state-of-the-art, burst-mode receivers use limiting amplifiers which are highly non-linear and prevent the use of e.g. electronic dispersion compensation.

2) Burst-mode receivers today employ gain switching front-ends. This is needed to ensure that the burst-mode receiver does not distort the signal for strong input signals. For these strong input signals, the gain of the burst-mode receiver front-end is switched to a lower value. These gain switching front-ends enable fast (typically in a few nanoseconds) adjustment of the gain during the preamble at the start of each burst. However these gain switching architectures show severe problems for input signal strengths close to the switching points, for example, as late switching may occur resulting in significant numbers of errors or the loss of entire bursts.

3) A burst-mode receiver typically needs a control signal that indicates the start of a new burst. As it is not known a priori when a new burst will arrive, the burst-mode receiver detects the arrival of a new burst itself. This is done by detecting the transition of the input from its zero level towards the level of the incoming burst. However, if detected from the first rising edge of the burst, the detected moment of arrival of the new burst may be highly inaccurate. Indeed this first rising edge may exhibit a high amount of jitter as the transmitter is still turning on (e.g. in case of a directly modulated laser there may be a significant turn-on delay). This is problematic for any receiver circuitry that relies on an accurate detection of the start of a new burst.

A number of attempted solutions to these problems have been proposed in the prior art. For example, a first publication (S. Nishihara et. al., 'A burst-mode 3R receiver for 10-Gbit/s PON systems with high sensitivity, wide dynamic range, and fast response', IEEE Journal of Lightwave Technology, vol. 26, pp. 99-107, January 2008) describes the concept of a 10 Gb/s burst-mode receiver, that uses gain switching to enlarge its dynamic range. There are two main problems with the solution proposed in this paper:—

1) The burst-mode receiver disclosed in the paper uses gain-switching to reduce its gain from a high state to a low state for sufficiently strong input bursts. This is done by comparing the strength of the burst with a fixed reference. If the strength of the burst is greater than this reference, the gain of the burst-mode receiver is switched to its Low state. This gain-switching however has a serious problem, in that a burst with strength close to this reference, may cause gain switching to occur too late, for example during the data portion of the burst.

2) The burst-mode receiver disclosed in the paper uses a limiting amplifier to amplify the signals to a level that is compatible with a given logical format (such as e.g. current-mode logic). Such Limiting action is highly non-linear, thus preventing the use of electronic dispersion compensation to mitigate transmission impairments due to e.g. chromatic dispersion.

A second publication (T. De Ridder, P. Ossieur et. al., 'A 2.7V 9.8-Gb/s burst-mode transimpedance amplifier with fast automatic threshold locking and coarse threshold extraction', pp. 220-221, in Technical Digest International Solid-State Circuits Conference (ISSCC), February 2008) describes the concept of a 10 Gb/s burst-mode receiver front-end that quickly switches gain again by comparing the strength of the incoming burst to a reference. In variance from the first publication, an additional gain locking mechanism has been added in an effort to solve the problem of late gain switching. The described gain locking mechanism has two disadvantages however. First, it relies upon the use of a flip-flop. If this flip-flop exhibits metastability, again late gain switching may occur. Secondly, the described gain locking mechanism only works for a transimpedance amplifier front-end whose gain can be switched to a limited number of discrete gain settings. This excludes implementation of the described mechanism, whereby its gain should scale inversely with the input signal strength.

European Patent Publication number EP1357665 describes an automatic gain control method for a burst-mode optical receiver. U.S. Pat. No. 7,539,424 describes an automatic gain control method for a burst-mode optical receiver. However these patents do not solve the problems of automatic gain control accuracy, non-linearity of the burst mode receiver and do not implement any method to extract timing signals from the data bursts. European Patent Publication number EP1032145, assigned to NEC corporation, discloses an automatic gain control method for a burst-mode optical receiver. A means is disclosed to monitor the strength of the incoming burst, and based upon this strength to adjust the gain of a transimpedance amplifier so that the voltage signal outputted from said transimpedance amplifier is not saturated. However a problem with this approach is that it does not provide a method to ensure that the swing of the transimpedance amplifier equals a given reference, and that avoiding saturation in the transimpedance amplifier is not sufficient to ensure linearity. This is an important feature that is required for a linear burst-mode receiver, as the reference (and hence output swing) can then be optimized to ensure the linearity of the burst-mode receiver; for example by minimising total harmonic distortion.

An additional problem with today's state-of-the-art conventional linear optical receivers is that they rely on slow feedback automatic gain control loops with settling times exceeding hundreds of microseconds. Such long settling times are clearly not suitable for optical access networks or optical burst switched networks where the receivers need to respond to a new incoming burst during a few nanoseconds at the start (commonly known as the preamble) of each burst.

Further, referring to today's state-of-the-art, European Patent Publication number EP1935091 describes a method to derive a signal from a new incoming burst that indicates the start of this new burst. However, as the derived signal uses the very first rising edge of this new incoming burst, the signal that indicates the start of this burst is potentially inaccurate. Indeed at the start of the burst, the transmitter may not be fully switched on which results in a high amount of jitter at the start of the burst. US Patent Publication number US2009/0142074/A1 describes a method to detect the start of an incoming burst, and subsequently delays this signal. The detection of the start of the burst is performed using a relatively low-speed determinator. This time has to be added to the settling time of the first amplifier (2), which will result in unacceptable delays and jitter in detecting the start of the burst.

It is clear from the state of the art that there is a need to provide a solution to the problems associated with utilising gain switching and limiting amplifiers in burst mode optical receivers. It is further clear from the state of the art that there is a need to provide a solution to the problem of generating a signal that precisely indicates the start of a new incoming burst.

An object of the present invention is to provide a linear burst mode receiver to overcome the above mentioned problems.

SUMMARY OF THE INVENTION

According to the present invention there is provided, as set out in the appended claims, a linear burst mode receiver comprising:
a first amplifier (2) connected to a photodiode (1) adapted to detect an optical input burst signal;
a first controllable feedback resistor (8) connected across said first amplifier (2) adapted to determine the gain of said first amplifier (2);
characterised by:
means for deriving the peak input current $I_1$ of the detected burst signal using a second amplifier (3), connected to the photodiode, and a peak voltage detector (4);
means to provide a copy of said peak input current $I_1$ to a second controllable resistor (9) matched to said first controllable resistor (8), whereby the control signals that control the resistance of said controllable resistors (8) and (9) comprise the same control signal $V_{AGC}$; and
means to adjust the resistance of said controllable resistor (9) such that the voltage drop across said controllable resistor (9) equals a given reference.

In one embodiment the reference equals the output voltage swing of the first amplifier, independent of the strength of the optical input burst signal. The linear burst-mode receiver of the present invention has a number of technical advantages:

1) The linear operation allows use of electronic dispersion compensation techniques, allowing in turn the use of cost-effective high-speed modulation in the ONUs (whereby transmission impairments stemming from the 'low-quality' modulators in the ONUs are compensated in the OLT), as well as certain classes of advanced modulation formats that require a linear receiver.

2) The fact that the output swing of the linear burst-mode receiver is equal to a reference (which can be adjusted), implies that the output swing of the linear burst-mode receiver can be optimized. For example, the output swing can be optimized to minimize the total harmonic distortion of the linear burst-mode receiver.

3) The use of the fast feed-forward automatic gain control mechanism solves the problems with gain switching prevalent in today's burst-mode receivers.

4) The detection of a more accurate timing reference that indicates the start of the burst allows more accurate control of circuits that need this timing reference.
   a. The reference pulse is only generated after the transmitter is fully switched on. This prevents ambiguity in determination of the start of the burst, which can otherwise arise due to transients and jitter on the first transition that may or may not occur at the start of the burst, when the transmitter is switching on;
   b. Part of the burst-mode receiver has already settled according to the strength of the incoming packet, allowing a significantly more robust detection of the transition of 0s to 1s (or vice-versa) later in the preamble.

It will be appreciated that the swing of said first amplifier (2) is now forced to equal a given reference, which can now be optimized to optimize the linearity of said first amplifier (2). The optimisation can be used to minimize the total harmonic distortion of the first amplifier.

In one embodiment there is provided a subsequent amplifier (16) which follows the amplifier (14) to provide additional gain and adapted to use a fast feed forward automatic gain control mechanism comprised of an arrangement of a replica of said amplifier for using the derived peak signal swing to automatically adjust the gain of said amplifier, such that the output voltage swing of said amplifier equals a given reference.

In one embodiment there is provided means to further linearly amplify the signal from the first amplifier, using an amplifier whose gain is again quickly adjusted according to the strength of its input.

In one embodiment there is provided a resistor matched to the feedback resistance of the second amplifier adapted for use with a reference voltage to convert the peak input voltage from the second amplifier into a peak input current I.

In one embodiment there is provided a peak voltage detector connected to the output of the second amplifier.

In one embodiment there is provided a fast feed forward automatic gain control mechanism comprised of an arrangement of replicas of the first amplifier for using the derived peak input current to automatically adjust the gain of the first amplifier, such that the output voltage swing of the first amplifier equals a given reference.

In one embodiment there is provided a means to adjust the reference voltages that set the swing of the linear burst-mode receiver, such that a parameter that describes the linearity of the burst-mode receiver (for example, total harmonic distortion) is optimized with respect to this swing.

In one embodiment there is provided means for detecting a well defined transition occurring sometime in the preamble after the start of the burst.

In one embodiment there is provided means for detecting the preamble at the start of the burst signal such that at a later time within said preamble where the burst signal is stable.

In one embodiment there is provided means for using the rising edge of the received burst signal to derive a blanking signal that is high during a defined amount of time.

In one embodiment there is provided a blanking signal adapted to disable to low when said first amplifier of the burst-mode receiver has stabilized.

In one embodiment there is provided said blanking signal is a variable and dependent on a consecutive number of 0's or 1' detected in said optical burst signal.

In one embodiment there is provided a first gain stage, which is adapted to use the output of the replica TIA as a reference, wherein the first gain stage acts as single-ended to differential converter.

In one embodiment there is provided a second gain stage comprising positive and negative peak detectors adapted to remove any unwanted dc-offsets.

In another embodiment there is provided a method for controlling a linear burst mode receiver comprising:
  connecting a first amplifier to a photodiode adapted to detect an optical input burst signal;
  connecting a second amplifier to said photodiode;
  deriving the peak input current of the detected burst signal using said second amplifier;
  using the derived peak input current to adjust the gain of the first amplifier during the preamble of each burst, such that the output voltage swing of the first amplifier equals a given reference, independent of the strength of the optical input burst signal.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
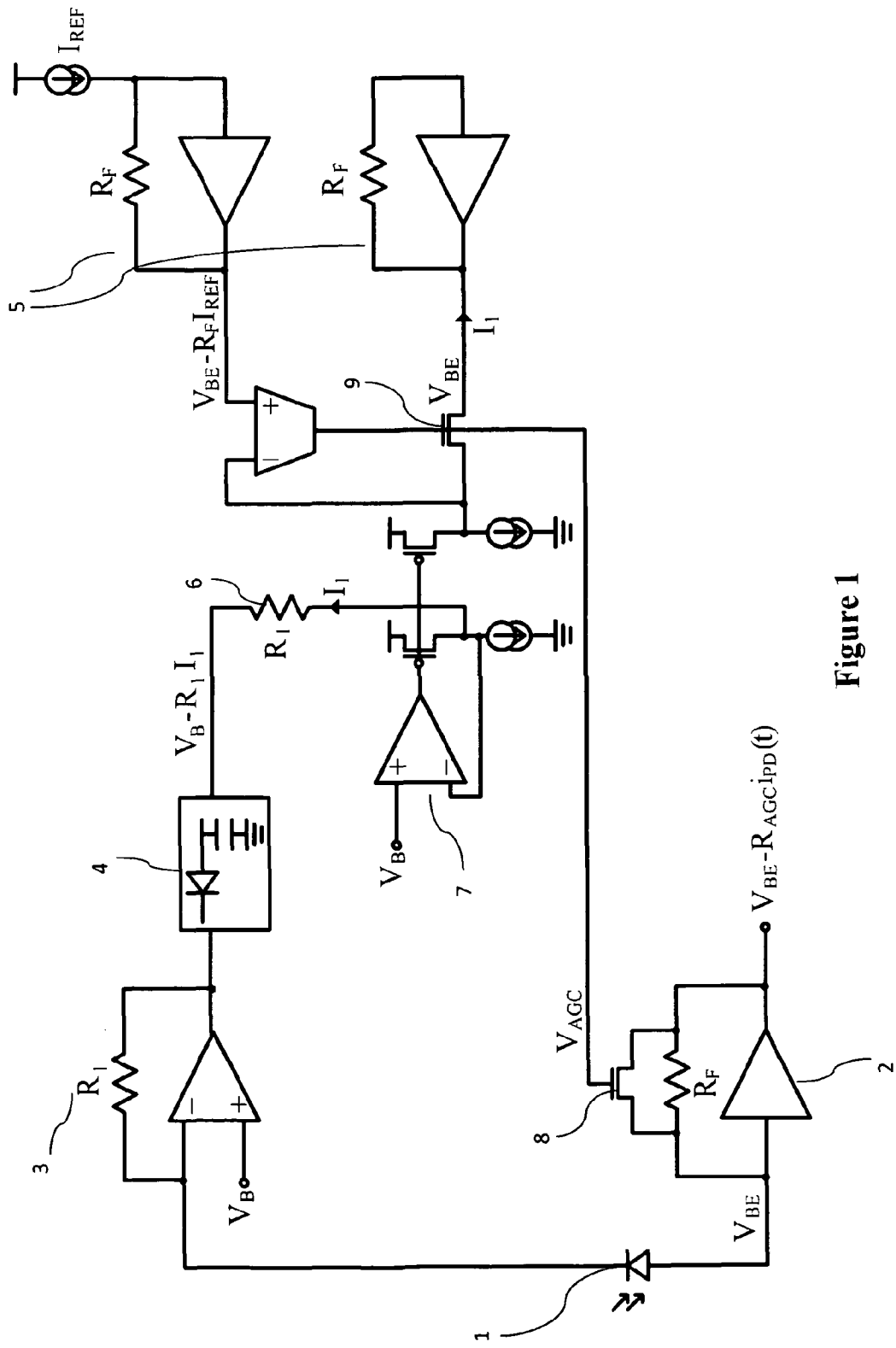
FIG. 1 shows the basic principle of the burst-mode receiver according to the invention.

FIG. 1 shows an example architecture of one implementation of the invention. A main first transimpedance amplifier (2) is connected to a photodiode (1), preferably an anode; a second auxiliary transimpedance amplifier (3) is connected to a photodiode, preferably the cathode. Using a peak detector (4) (which can be reset after the end of each packet) the peak output voltage of the auxiliary transimpedance amplifier is detected. Using a resistor R1 (6) matched to the feedback resistance of the auxiliary transimpedance amplifier (3) and a reference voltage this peak voltage is converted into the peak current $I_1$ (current received for an input '1') of the incoming packet using (7).

This peak current $I_1$ is then copied and sent through a replica MOSFET (9) that acts as a voltage controlled resistor, its drain voltage is forced to equal $V_{BE}$ (the input bias voltage of the main transimpedance amplifier (2)). In a feedback loop, the resistance of this replica MOSFET is adjusted (using (5)) by steering its gate voltage such that the voltage across this MOSFET equals a given reference voltage ($V_{REF}=R_F \times I_{REF}$). A MOSFET (8) matched to replica MOSFET (9) is connected across the main transimpedance amplifier. Consequently, the gain of the main transimpedance amplifier now equals $R_{AGC}=V_{REF}/I_1$. Once the loop has settled, the output voltage swing of the main transimpedance amplifier equals $R_F \times I_{REF}$, which is independent of the strength of the incoming packet. Using the same gate voltage of the replica MOSFET (9) to drive the matched MOSFET (8) we get that $V_{out}=R_{AGC} \times i_{PD}(t)=V_{REF}/I_1 \cdot i_{ID}(t)$ and that the TIA output=$V_{REF}$ for a received '1' and =$V_{REF}/Ex$ (Ex=extinction ratio) for a received '0'. Unlike conventional linear optical receivers that use Automatic Gain Control (AGC) to adjust their gain according to the input signal, fast settling of the gain can be achieved as: 1) derivation of the strength of the input current can use a sufficiently fast second auxiliary amplifier and peak detector; 2) a simple feedback loop that does not include the main transimpedance amplifier is sufficient to adjust the gain of the main transimpedance amplifier.

Figure 2:
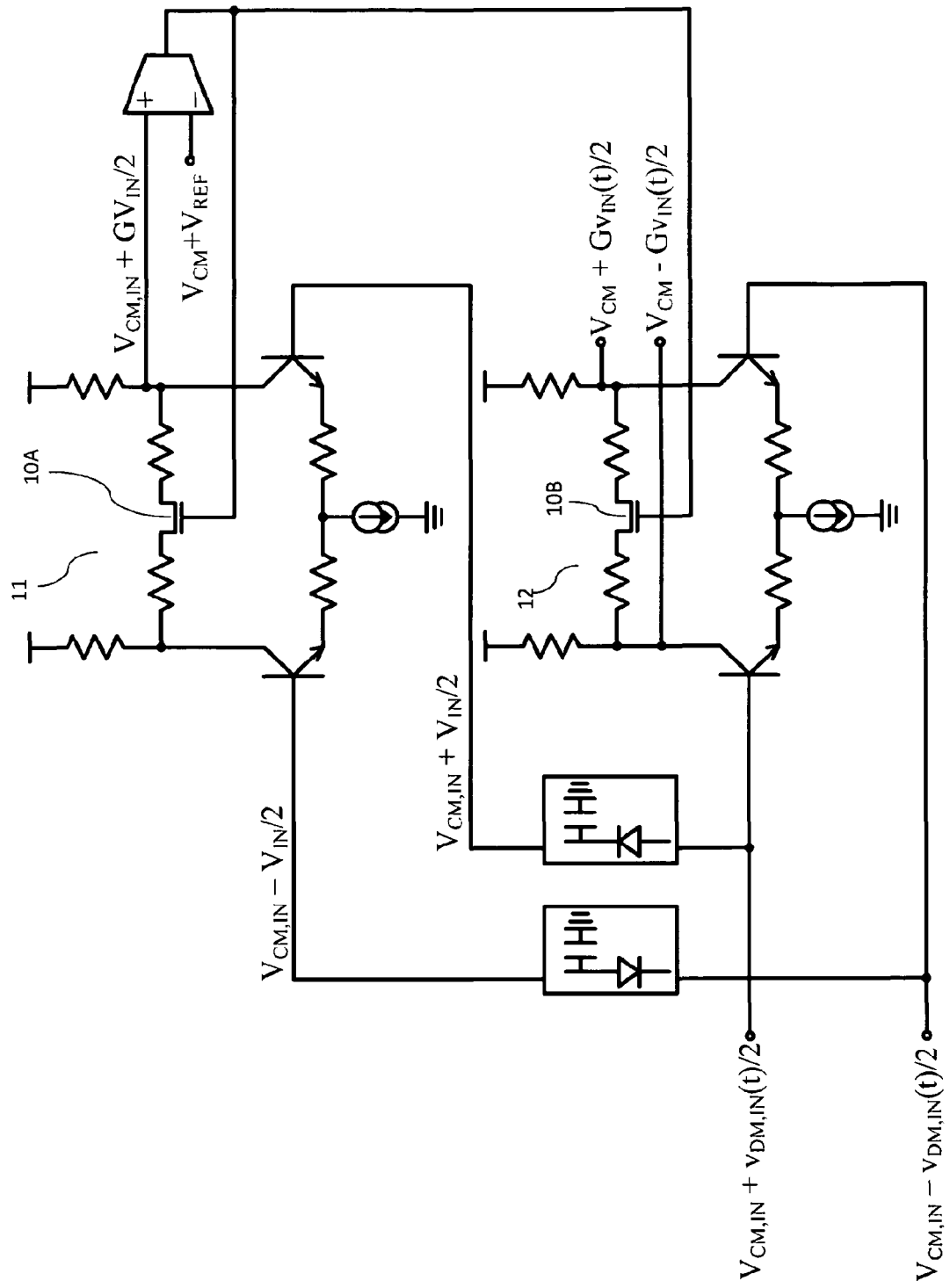
FIG. 2 shows a post amplifier using replica based feed forward automatic gain control.

Referring to FIG. 2, FIG. 2 presents a post amplifier using replica based feed forward AGC, the post amplifier is designed to detect the peak voltage of the input signal, and from this, use the peak voltage to adjust the gain of the replica amplifier (11) to a known value. The gain can be controlled by adjusting the gate voltage of a replica MOSFET (10A) used in triode region (voltage controlled resistor). The gate voltage from the replica MOSFET (10A) was then used to set gain of real amplifier (12) by modifying the gate voltage of its MOSFET (10B). If the feedback loop operates, then the gain $G=2V_{REF}/V_{IN}$.

Figure 3:
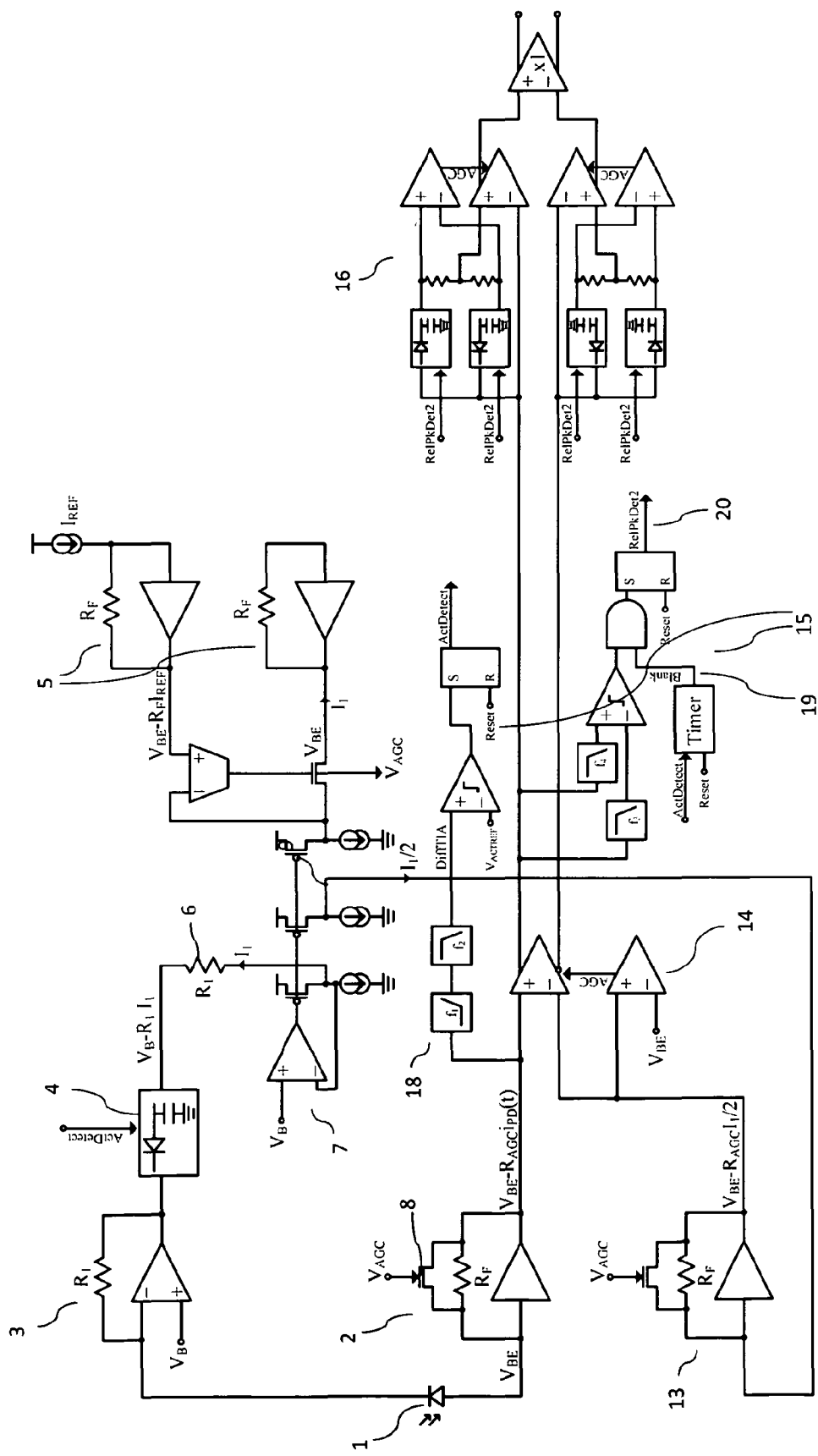
FIG. 3 shows a top level architecture of the invention.

FIG. 3 illustrates a more detailed embodiment of FIG. 1, where two gain stages (14) and (16) which add additional gain, required if weak input signals need to be received. The first gain stage (14) uses the output of the replica TIA (13) as reference, the first stage also acts as single-ended to differential converter.

The second gain stage (16) deals with the unavoidable dc-offsets using positive and negative peak detectors to remove said dc-offsets.

Figure 4:
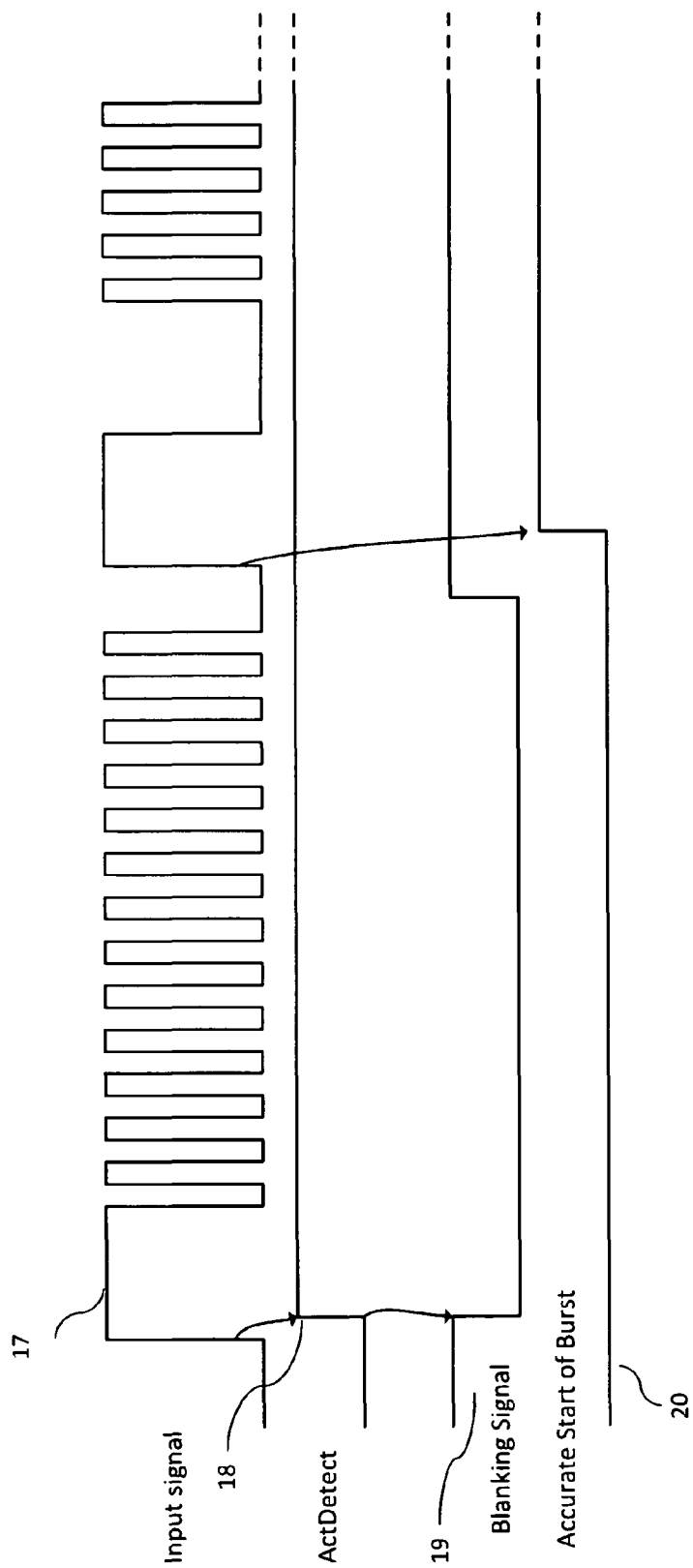
FIG. 4 illustrates a method to detect the start of an incoming packet in a burst mode optical receiver according to the invention.

FIG. 3 also adds some control circuitry (15) (18) which in conjunction with FIG. 4 provide an improved method to detect the start of an incoming packet using the following steps:

1) Choose the contents of the preamble at the start of the packet such that at a later time within this preamble, there exists a sufficiently long sequence of 0s, followed by a sufficiently long sequence of 1s (or vice-versa);

2) Detect the first rising edge of the incoming packet (17) resulting in signal (18) whose rising edge indicates the start of the new burst. This first rising edge is potentially inaccurate due to transmitter turn-on delays and transients and the fact that the signal on which the rising edge is being detected can be weak;

3) Use the rising edge on signal (18) to derive a blanking signal (19) that is high during a specified amount of time.

4) Use this blanking signal (19) to disable the output of the circuitry (20) that detects the aforementioned transition of sequence of 0s to 1s (or vice-versa) until the transmitter is fully on, and the transimpedance amplifier of the burst-mode receiver has stabilized. After this time period, the blanking signal is de-asserted and the circuitry (20) that detects the aforementioned transition of 0s to 1s (or 1s to 0s) is enabled. Release second series of peak detectors (16).

5) Detect the transition of the aforementioned 0s to 1s (or 1s to 0s).

Detection of this second transition later in the preamble gives rise to a significantly more accurate indication of the start of the burst because by this time the transmitter is fully switched on. As a result, the ambiguity in the identification of the burst start time, which can arise due to transmitter turn-on transients, is removed. In addition part of the burst-mode receiver has already run in according to the strength of the incoming packet, allowing a significantly more robust detection of the transition of 0s to 1s (or 1s to 0s) later in the preamble.

It will be appreciated that by connecting a second auxiliary transimpedance amplifier to the cathode of the photodiode (which in a conventional optical receiver is merely connected to a supply voltage), the following can be achieved. It is now possible to separately optimize the two transimpedance amplifiers connected to the photodiode for different purposes. More specifically, the main transimpedance amplifier can be optimized for detection of high-speed data (e.g. in the case of conventional Non-Return-to-Zero (NRZ) it needs to have a bandwidth approx. equal to 75% of the target bit rate, have high gain and low input referred noise current as well as the added possibility of reducing its gain for high input powers), while the second auxiliary transimpedance amplifier can be optimized for detection of the peak input current of the incoming packet (more specifically it will have a much lower bandwidth compared to the main transimpedance amplifier and a reduced gain such that it is linear over the entire input dynamic range). This then allows accurate detection of the peak current of the incoming packet (using a peak detector), which is problematic if only the main transimpedance amplifier is used for this purpose. It also allows for the use of a burst-mode receiver in combination with electronic dispersion compensation due its linear operation in detecting peak input current. This is something not previously possible with gain limiting (non linear) implementations.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A linear burst mode receiver comprising:
a first amplifier connected to a photodiode adapted to detect an optical input burst signal;
a first controllable feedback resistor connected across said first amplifier adapted to determine the gain of said first amplifier;
comprising
means for deriving the peak input current $I_1$ of the detected burst signal using a second amplifier, connected to the photodiode, and a peak voltage detector;
means to provide a copy of said peak input current $I_1$ to a second controllable resistor matched to said first controllable resistor, whereby the control signals that control the resistance of said controllable resistors comprise the same control signal $V_{AGC}$; and
means to adjust the resistance of said controllable resistor such that the voltage drop across said controllable resistor equals a given reference.

2. The receiver as claimed in claim 1, wherein the reference equals the output voltage swing of the first amplifier, independent of the strength of the optical input burst signal.

3. The receiver as claimed in claim 1 wherein said means for deriving the peak input current $I_1$ of the detected burst signal comprises a resistor matched to a feedback resistance of the second amplifier adapted for use with a reference voltage to convert the peak output voltage from the peak voltage detector into the peak input current $I_1$ of the burst-mode receiver.

4. The receiver as claimed in claim 1, further comprising means to provide a copy of half of said peak input current $I_1$ to an amplifier that is a matched copy of said first amplifier, whose gain is determined by a controllable feedback resistor matched to said controllable resistors, and sharing the same control signal $V_{AGC}$.

5. The receiver as claimed in claim 4 wherein a gain stage amplifies the signal from the first amplifier and which is adapted to use the output of said matched copy as a reference, wherein said gain stage acts as single-ended to differential converter.

6. The receiver as claimed in claim 1, further comprising a subsequent amplifier which follows the amplifier to provide additional gain and adapted to use a fast feed forward automatic gain control mechanism comprised of an arrangement of a replica of said amplifier for using the derived peak signal swing to automatically adjust the gain of said amplifier, such that the output voltage swing of said amplifier equals the given reference.

7. The receiver as claimed in claim 1 further comprising means for detecting a time within the preamble of the incoming burst that is representative of the start of the incoming burst, derived from a signal transition within said preamble where the gain of said first amplifier and said gain stage have stabilized.

8. The receiver as claimed in claim 1 further comprising means for using the rising edge of the received burst signal to derive a blanking signal that is high during a defined amount of time;
means whereby said blanking signal is adapted to disable to low when the gain of said first amplifier and gain stage of the burst-mode receiver have stabilized.

9. The receiver of claim 8 further comprising means to detect a rising or falling edge that occurs after said blanking signal is disabled by comparing the output of said gain stage to a given reference.

10. The receiver as claimed in claim 1 wherein a second gain stage comprises positive and negative peak detectors adapted to remove any unwanted dc-offsets.

11. An optical communication network comprising the receiver of claim 1.

\* \* \* \* \*